(12) United States Patent
Midorikawa et al.

(10) Patent No.: US 11,742,033 B2
(45) Date of Patent: Aug. 29, 2023

(54) VOLTAGE GENERATION CIRCUIT WHICH IS CAPABLE OF EXECUTING HIGH-SPEED BOOST OPERATION

(71) Applicant: Kioxia Corporation, Tokyo (JP)

(72) Inventors: Tatsuro Midorikawa, Kamakura (JP); Masami Masuda, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/647,509

(22) Filed: Jan. 10, 2022

(65) Prior Publication Data

US 2022/0130471 A1    Apr. 28, 2022

Related U.S. Application Data

(63) Continuation of application No. 17/031,656, filed on Sep. 24, 2020, now Pat. No. 11,250,919, which is a continuation of application No. 16/670,862, filed on Oct. 31, 2019, now Pat. No. 10,818,364, which is a continuation of application No. 16/273,979, filed on Feb. 12, 2019, now Pat. No. 10,515,706, which is a continuation of application No. 15/417,489, filed on Jan. 27, 2017, now Pat. No. 10,242,748, which is a continuation of application No. 14/257,501, filed on Apr. 21, 2014, now Pat. No. 9,589,656, which is a
(Continued)

(30) Foreign Application Priority Data

Nov. 1, 2010   (JP) .................. 2010-245285

(51) Int. Cl.
*G11C 16/30*     (2006.01)
*H02M 3/07*      (2006.01)

(52) U.S. Cl.
CPC .............. *G11C 16/30* (2013.01); *H02M 3/07* (2013.01)

(58) Field of Classification Search
CPC ................................ G11C 16/30; H02M 3/07
See application file for complete search history.

(56) References Cited

U.S. PATENT DOCUMENTS 5,081,371 A    1/1992   Wong
5,563,779 A   10/1996   Cave
(Continued)

FOREIGN PATENT DOCUMENTS

JP   2007-87513   4/2007

*Primary Examiner* — Jue Zhang
(74) *Attorney, Agent, or Firm* — Oblon, McClelland, Maier & Neustadt, L.L.P.

(57) ABSTRACT

According to one embodiment, a voltage generation circuit includes a first boost circuit, a voltage division circuit, a first detection circuit, a capacitor and a first switch. The first boost circuit outputs a first voltage. The voltage division circuit divides the first voltage. The first detection circuit is configured to detect a first monitor voltage supplied to the first input terminal, based on a reference voltage which is supplied to a second input terminal of the first detection circuit, and to control an operation of the first boost circuit. The capacitor is connected between an output terminal of the first boost circuit and the first input terminal of the first detection circuit. The first switch cuts off a connection between the capacitor and the first detection circuit, based on an output signal of the first detection circuit, until the first voltage is output from the first boost circuit.

8 Claims, 7 Drawing Sheets

Related U.S. Application Data continuation of application No. 13/235,437, filed on Sep. 18, 2011, now Pat. No. 8,755,235.

(56) References Cited

U.S. PATENT DOCUMENTS

| | | | |
|---|---|---|---|
| 5,712,777 A | 1/1998 | Nicollini | |
| 5,732,039 A | 3/1998 | Javanifard | |
| 5,946,207 A | 8/1999 | Schoofs | |
| 6,005,378 A | 12/1999 | D'Angelo | |
| 6,018,264 A | 1/2000 | Jin | |
| 6,151,229 A | 11/2000 | Taub | |
| 6,259,612 B1 * | 7/2001 | Itoh | H02M 3/07 363/60 |
| 6,404,274 B1 | 6/2002 | Hosono | |
| 6,456,153 B2 | 9/2002 | Buck | |
| 6,472,926 B2 | 10/2002 | Taito | |
| 6,504,422 B1 | 1/2003 | Rader | |
| 6,597,158 B2 | 7/2003 | Umeda | |
| 6,717,459 B2 | 4/2004 | Blodgett | |
| 6,724,241 B1 | 4/2004 | Bedarida | |
| 6,798,274 B2 | 9/2004 | Tanimoto | |
| 6,873,203 B1 | 3/2005 | Latham, II | |
| 6,882,015 B2 | 4/2005 | Bernstein et al. | |
| 7,315,194 B2 | 1/2008 | Shiga | |
| 7,414,459 B2 | 8/2008 | Pisasale et al. | |
| 7,443,734 B2 | 10/2008 | Shibata | |
| 7,502,239 B2 | 3/2009 | Itoh | |
| 7,550,954 B2 | 6/2009 | De Nisi | |
| 7,554,305 B2 | 6/2009 | Nunokawa | |
| 7,679,430 B2 | 3/2010 | Fort et al. | |
| 7,755,417 B2 | 7/2010 | Suzuki | |
| 7,884,665 B2 | 2/2011 | Saikusa | |
| 7,898,851 B2 | 3/2011 | Maejima et al. | |
| 7,973,592 B2 | 7/2011 | Pan | |
| 8,044,705 B2 | 10/2011 | Nandi | |
| 8,334,681 B2 | 12/2012 | Arigliano | |
| 8,710,762 B2 | 4/2014 | Takahashi | |
| 8,710,911 B2 | 4/2014 | Chien | |
| 8,970,189 B2 | 3/2015 | Nakashima | |
| 9,070,434 B2 | 6/2015 | Hioka | |
| 10,818,364 B2 | 10/2020 | Midorikawa et al. | |
| 2003/0197546 A1 | 10/2003 | Sim | |
| 2004/0095806 A1 | 5/2004 | Osawa | |
| 2005/0168263 A1 | 8/2005 | Fukuda et al. | |
| 2007/0064495 A1 | 3/2007 | Shibata | |
| 2009/0159949 A1 | 6/2009 | Maejima et al. | |
| 2011/0316512 A1 | 12/2011 | Tanzawa | |

* cited by examiner

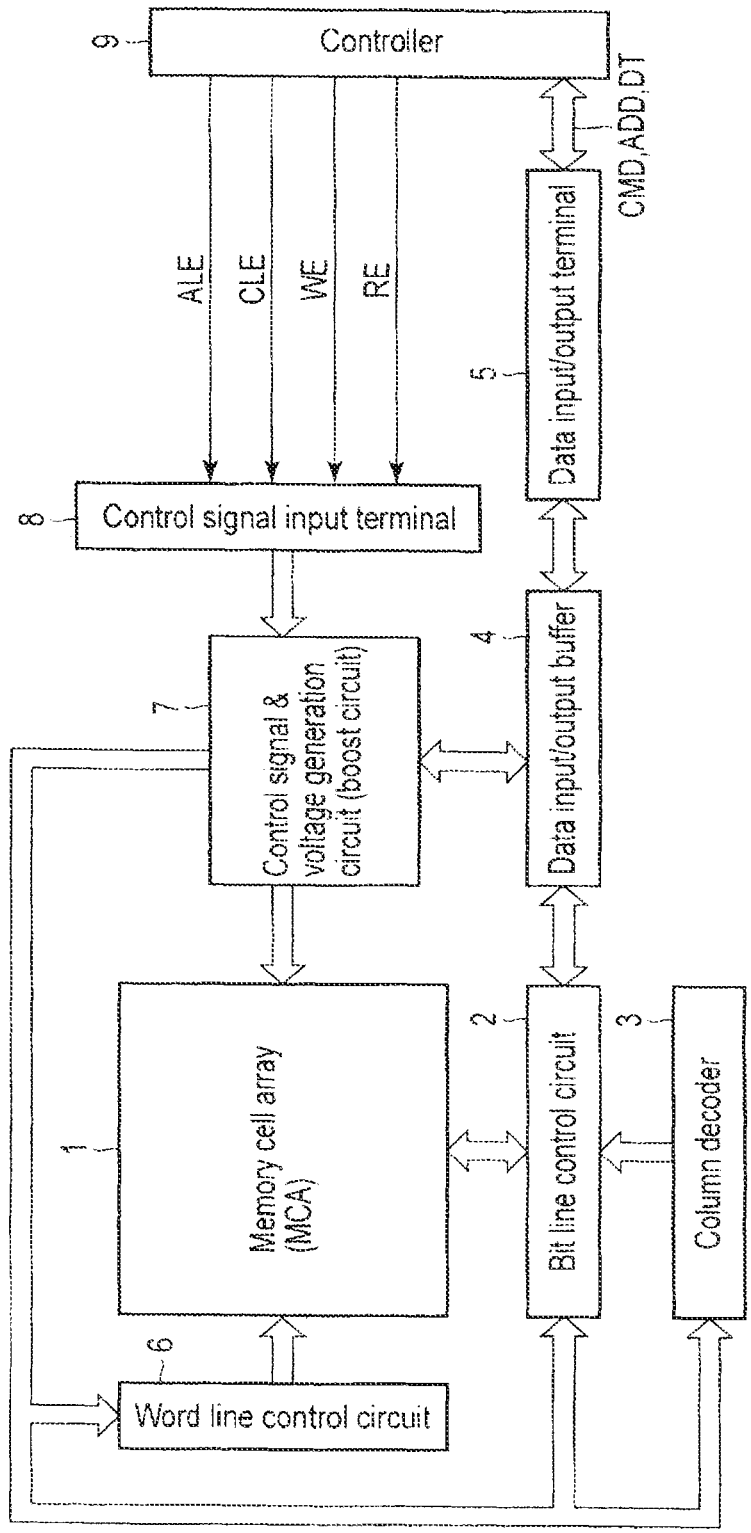
F I G. 1

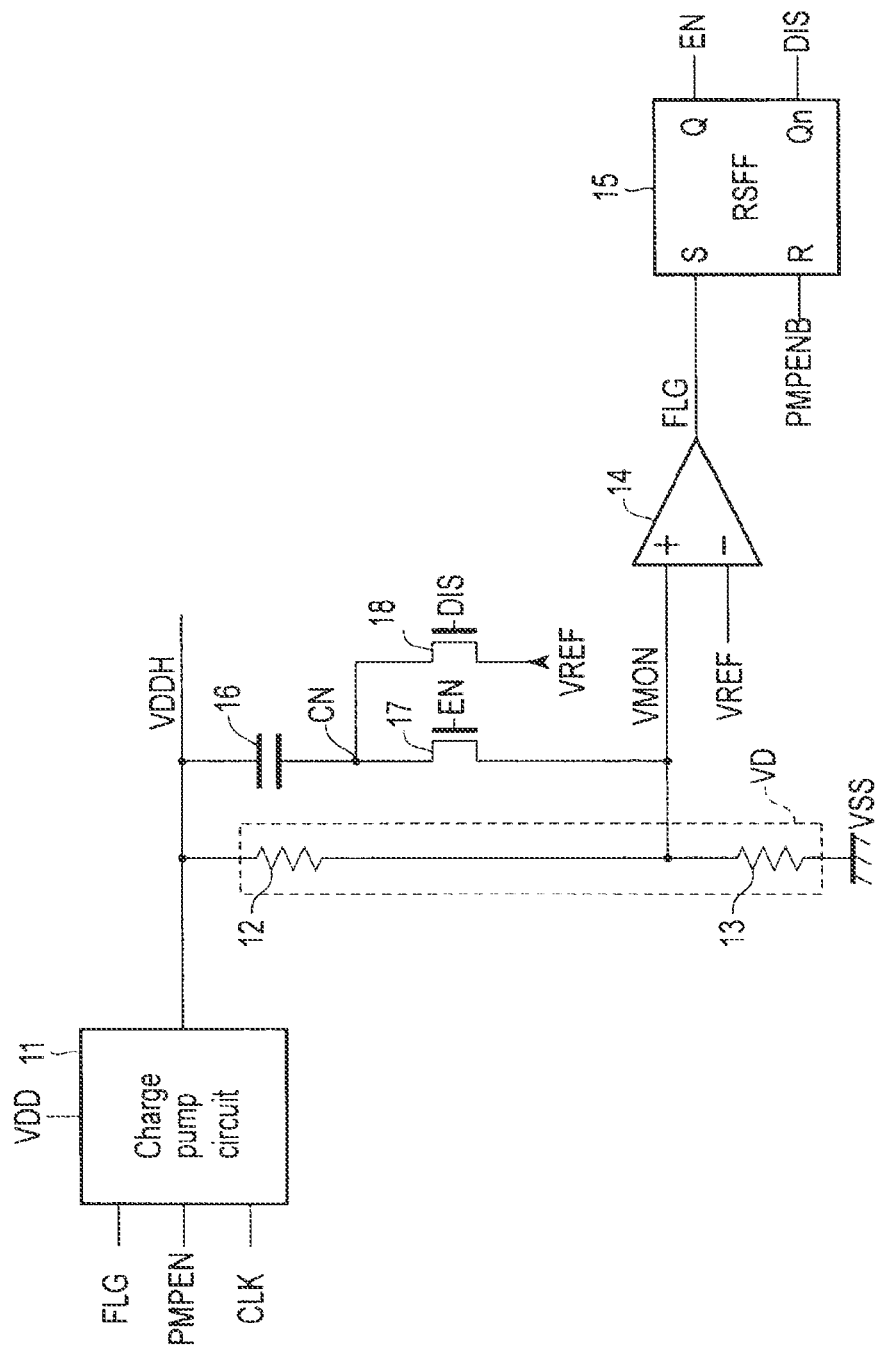
F I G. 5

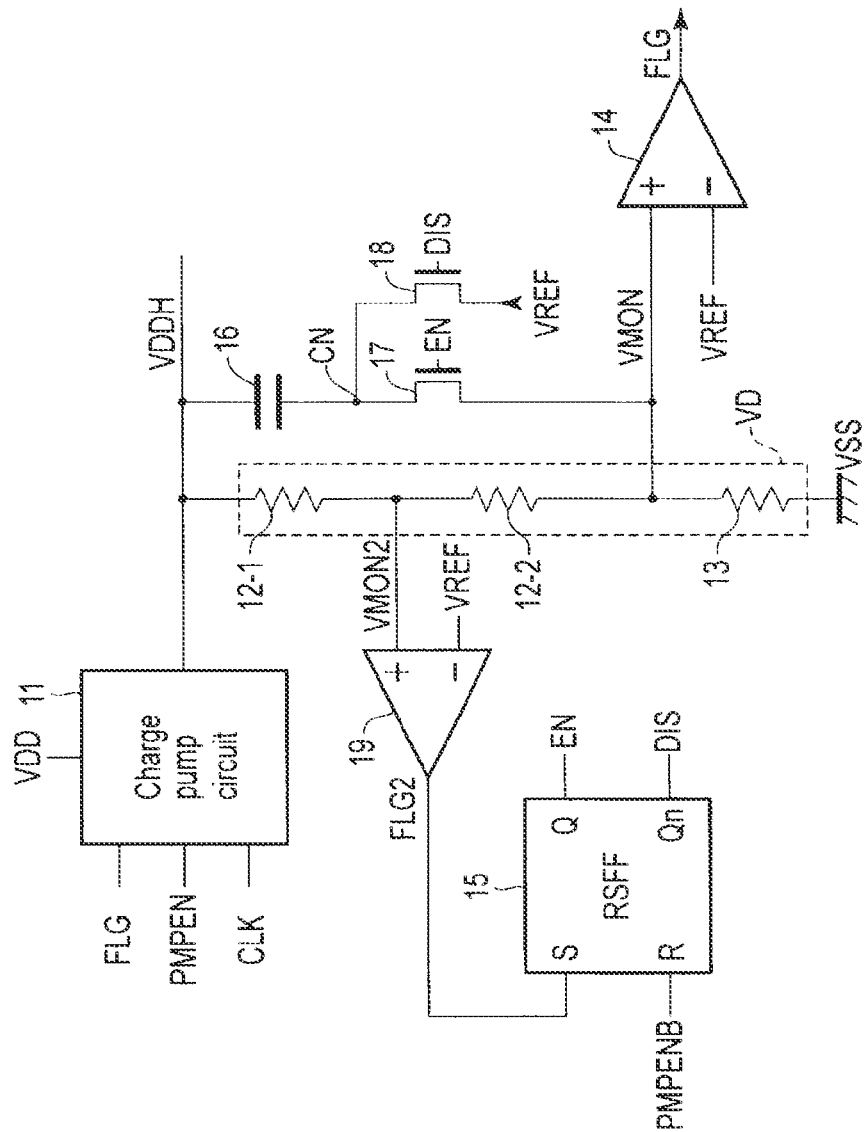
F I G. 7

VOLTAGE GENERATION CIRCUIT WHICH IS CAPABLE OF EXECUTING HIGH-SPEED BOOST OPERATION

CROSS-REFERENCE TO RELATED APPLICATIONS

This application is a continuation application of U.S. application Ser. No. 17/031,656, filed Sep. 24, 2020, which is a continuation application of U.S. Pat. No. 10,818,364, issued Oct. 27 2020, which is a continuation application of U.S. Pat. No. 10,515,706, issued Dec. 24, 2019, which is a continuation of U.S. Pat. No. 10,242,748, issued Mar. 26, 2019, which is a continuation of U.S. Pat. No. 9,589,656, issued Mar. 7, 2017, which is continuation application of U.S. Pat. No. 8,755,235, issued on Jun. 17, 2014, which is based upon and claims the benefit of priority from prior Japanese Patent Application No. 2010-245285, filed Nov. 1, 2010, the entire contents of each of which are incorporated herein by reference.

FIELD

Embodiments described herein relate generally to a voltage generation circuit which is applied to a semiconductor memory device, for example, a NAND flash memory.

BACKGROUND

A NAND flash memory uses high voltages which are higher than an external power supply voltage at times of write and erase. These high voltages are generated by using a charge pump circuit functioning as a boost circuit. An output voltage of the charge pump circuit is detected by a detection circuit, and the operation of the charge pump circuit is controlled based on an output signal of the detection circuit.

When the charge pump circuit starts to operate, a ripple component occurs in the output voltage. In the case where such a ripple component is to be suppressed, the boost operation delays.

BRIEF DESCRIPTION OF THE DRAWINGS

FIG. 1 schematically shows the structure of an example of a semiconductor memory device to which embodiments are applied.

FIG. 5 is a circuit diagram showing the structure of a voltage generation circuit according to a second embodiment.

FIG. 7 is a circuit diagram showing the structure of a voltage generation circuit according to a third embodiment.

DETAILED DESCRIPTION

Figure 2:
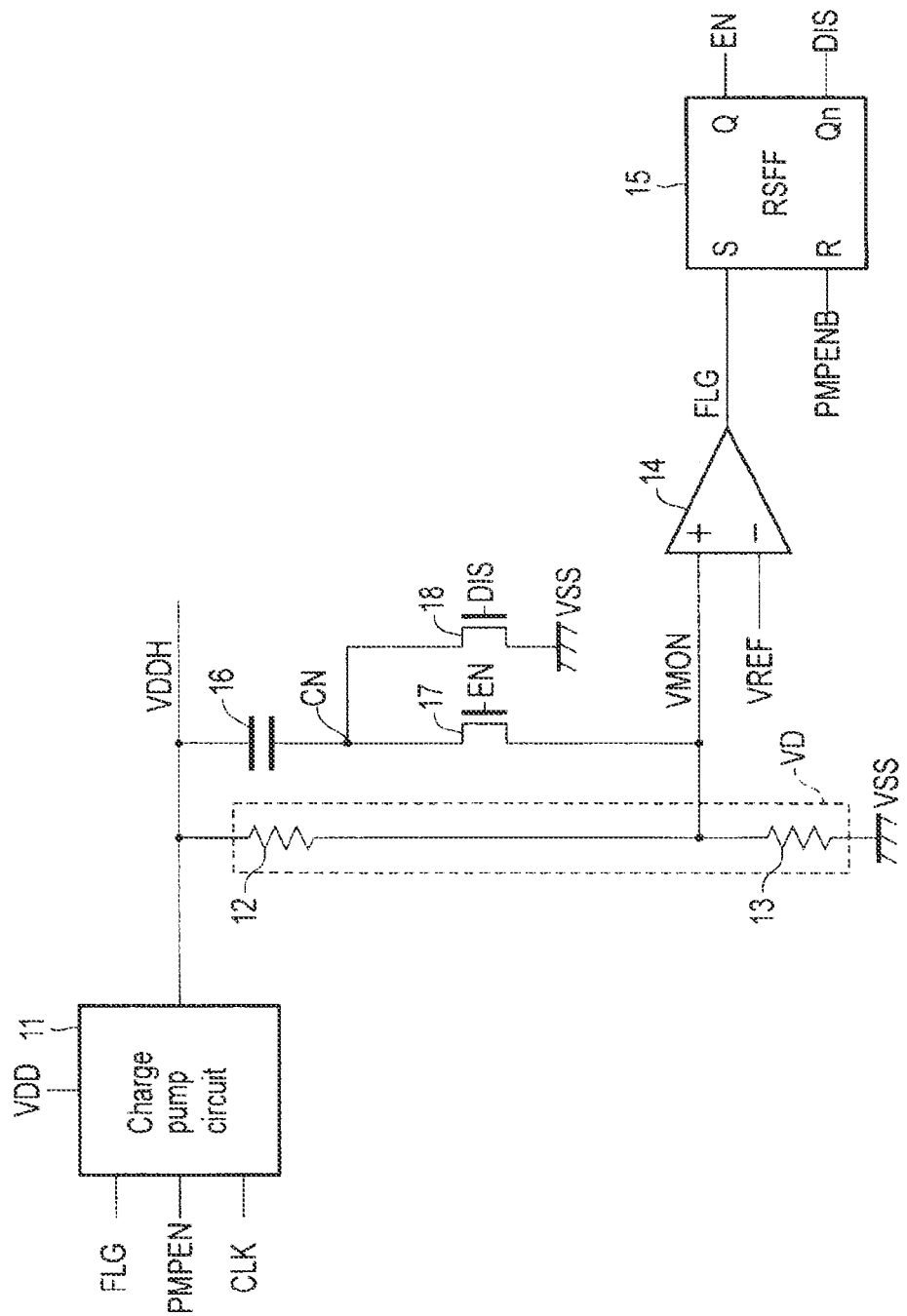
FIG. 2 is a circuit diagram showing the structure of a voltage generation circuit according to a first embodiment.

In general, according to one embodiment, a voltage generation circuit includes a first boost circuit, a voltage division circuit, a first detection circuit, a capacitor and a first switch. The first boost circuit outputs a first voltage. The voltage division circuit divides the first voltage. The first detection circuit has a first input terminal connected to the voltage division circuit, the first detection circuit being configured to detect a first monitor voltage supplied to the first input terminal, based on a reference voltage which is supplied to a second input terminal of the first detection circuit, and to control an operation of the first boost circuit. The capacitor is connected between an output terminal of the first boost circuit and the first input terminal of the first detection circuit. The first switch cuts off a connection between the capacitor and the first detection circuit, based on an output signal of the first detection circuit, until the first voltage is output from the first boost circuit.

For example, in a voltage generation circuit which is applied to a NAND flash memory, in order to suppress a ripple component in an output voltage of a charge pump circuit (also referred to as "pump circuit"), a capacitor for compensating a phase is provided between an output terminal of the pump circuit and an input terminal of a detection circuit. However, in the case where this capacitor is provided, the output voltage of the pump circuit quickly rises at the time of activating the pump circuit, and consequently a monitor voltage of the detection circuit rises to a reference voltage or more due to coupling of the capacitor. As a result, the detection circuit malfunctions, and the operation of the pump circuit is stopped. The operation and stop of the pump circuit are repeated, and the boost operation itself of the pump circuit delays. In the embodiment, the speed of the detection operation of the detection circuit is increased, and the speed of the boost operation of the pump circuit is increased.

Embodiments will now be described with reference to the accompanying drawings.

FIG. 1 shows the structure of a NAND flash memory functioning as a semiconductor memory device to which the embodiments are applied.

A memory cell array 1 includes a plurality of bit lines, a plurality of word lines, and common source lines. In the memory cell array 1, electrically data rewritable memory cells, which are composed of, e.g. EEPROM cells, are arranged in a matrix. A bit line control circuit 2 for controlling the bit lines and a word line control circuit 6 are connected to the memory cell array 1.

The bit line control circuit 2 executes such operations as reading out data of memory cells in the memory cell array 1 via the bit lines, detecting the states of the memory cells in the memory cell array 1 via the bit lines, and writing data in the memory cells by applying a write control voltage to the memory cells in the memory cell array 1 via the bit lines. A column decoder 3 and a data input/output buffer 4 are connected to the bit line control circuit 2. Data storage circuits in the bit line control circuit 2 are selected by the column decoder 3. The data of the memory cell, which has been read out to the data storage circuit, is output to the outside from a data input/output terminal 5 via the data input/output buffer 4. The data input/output terminal 5 is connected to a controller 9. The controller 9 is composed of, for example, a microcomputer, and receives data which is output from the data input/output terminal 5. In addition, the controller 9 outputs various commands CMD, addresses ADD and data DT, which control the operation of the NAND flash memory. The write data, which has been input from the controller 9 to the data input/output terminal 5, is supplied via the data input/output buffer 4 to the data storage circuit which has been selected by the column decoder 3. The commands and address are supplied to a control signal & voltage generation circuit (hereinafter also referred to as "boost circuit") 7 which generates various control signals and voltages.

The word line control circuit 6 is connected to the memory cell array 1. The word line control circuit 6 selects a word line in the memory cell array 1, and applies a voltage, which is necessary for read, write or erase, to the selected word line.

The memory cell array 1, bit line control circuit 2, column decoder 3, data input/output buffer 4 and word line control circuit 6 are connected to the control signal & voltage generation circuit 7 and are controlled by this control signal & voltage generation circuit 7. The control signal & voltage generation circuit 7 is connected to a control signal input terminal 8 and is controlled by control signals ALE (address latch enable), CLE (command latch enable), WE (write enable) and RE (read enable), which are input from the controller 9 via the control signal input terminal 8. The control signal & voltage generation circuit 7 includes, for example, a charge pump circuit which functions as a boost circuit. The control signal & voltage generation circuit 7 generates, for example, a program voltage and other high voltages, which are supplied to the word lines and bit lines, at the time of data write, and generates, for example, an erase voltage, which is supplied to a well, at the time of data erase.

First Embodiment

FIG. 2 shows an example of the boost circuit 7 according to a first embodiment. The boost circuit 7 includes a charge pump circuit 11. The charge pump circuit 11 is composed of, for example, a series circuit of a plurality of diode-connected transistors, and a plurality of capacitors which are connected at one end to connection nodes of the diodes and are supplied at the other end with a clock signal. The structure of the charge pump circuit 11 is not limited to this example. The charge pump circuit 11 is supplied with, for example, a power supply voltage VDD, a pump enable signal PMPEN which renders the pump circuit operable, a flag signal FLG which is supplied from a detection circuit (to be described later), and a clock signal CLK. The charge pump circuit 11 boosts the power supply voltage VDD, and generates a voltage VDDH which is higher than the power supply voltage VDD. The voltage VDDH is output from an output terminal.

A voltage division circuit VD is connected between the output terminal of the charge pump circuit 11 and a ground VSS terminal. The voltage division circuit VD is composed of a series circuit of resistors 12 and 13. A connection node between the resistors 12 and 13 is connected to one of input terminals of an operational amplifier 14 which functions as a comparator. A reference voltage VREF is supplied to the other input terminal of the operational amplifier 14. The voltage division circuit VD and operational amplifier 14 constitute a detection circuit.

The operational amplifier 14 compares the reference voltage VREF and a monitor voltage VMON which is supplied from the voltage division circuit VD. When the monitor voltage VMON exceeds the reference voltage VREF, the operational amplifier 14 outputs, for example, a flag signal FLG of a high level from the output terminal. This flag signal FLG is supplied to the charge pump circuit 11 and to a set input terminal S of an RS flip-flop circuit (RSFF) 15. An inversion signal PMPENB of the pump enable signal is supplied to a reset input terminal R of the flip-flop circuit 15.

The flip-flop circuit 15 is set by the flag signal FLG, and the flip-flop circuit 15 outputs, for example, an enable signal EN of a high level from a set output terminal Q and a disable signal DIS of a low level from a reset output terminal Qn. In addition, the flip-flop circuit 15 is reset by the inversion signal PMPENB.

On the other hand, one end of a capacitor 16 is connected to the output terminal of the charge pump circuit 11. The capacitor 16 is set to such a capacitance and a size that a ripple component can be suppressed when the output voltage of the charge pump circuit 11 reaches a predetermined voltage. The other end of the capacitor 16 is connected to the one input terminal of the operational amplifier 14 via, for example, an N-channel MOS transistor (also referred to simply as "transistor") 17 which functions as a switch. Specifically, the series circuit of the capacitor 16 and transistor 17 is connected in parallel to the resistor 12.

Besides, an N-channel MOS transistor 18, for example, which functions as a switch, is connected between a connection node CN of the capacitor 16 and transistor 17 and the ground (VSS). The gate electrode of the transistor 17 is supplied with the enable signal EN which is output from the set output terminal Q of the flip-flop circuit 15, and the gate electrode of the transistor 18 is supplied with the disable signal DIS which is output from the reset output terminal Qn of the flip-flop circuit 15.

In the meantime, the enable signal EN and disable signal DIS, which are output from the flip-flop circuit 15, have such voltages that the threshold voltages of the transistors 17 and 18 can be ignored.

The transistors 17 and 18, which function as switches, may be replaced with, for example, transfer gates. By using the transfer gates, the voltage VDD, instead of a high voltage, can be used for the output voltage of the flip-flop circuit 15.

Figure 3:
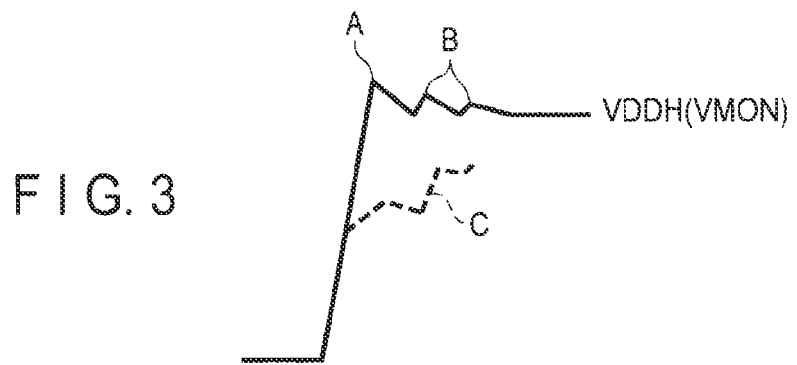
FIG. 3 is a waveform diagram showing an example of an input voltage of a detection circuit.

In the above structure, the resistors 12 and 13, which constitute the voltage division circuit VD, should desirably have high resistance values, thereby to reduce the consumption of current of the chip in which the NAND flash memory is mounted. However, when the resistors 12 and 13 having high resistance values are used, the response speed of the detection circuit lowers and the rising of the VMON, relative to the boost voltage of VDDH, delays, and, as a result, VDDH rises to a predetermined voltage or more. Thus, as shown in FIG. 3, an overshoot A or a ripple component B occurs in the output voltage VDDH of the charge pump circuit 11. The overshoot A or ripple component B promotes the degradation of the transistor which is supplied with the output voltage of the charge pump circuit 11.

In order to improve the response speed of the detection circuit, the capacitor 16 for compensating the phase is provided between the output terminal of the charge pump circuit 11 and the output node of the voltage division circuit VD. By the capacitor 16, it is possible to improve the response speed of the monitor voltage VMON relative to the variation of the output voltage VDDH of the charge pump circuit 11, and to suppress the overshoot or ripple component.

However, by the provision of the capacitor 16, as described above, the detection circuit malfunctions immediately after the charge pump circuit 11 starts boost, and the operation and stop of the charge pump circuit 11 are repeated. Thus, as indicated by C in FIG. 3, the output voltage of the charge pump circuit 11 varies, and the boost operation of the charge pump circuit 11 is delayed. Taking this into account, in the present embodiment, the capacitor 16 is cut off from the detection circuit during the period from the start of the boost of the charge pump circuit 11 until the boost up to a predetermined voltage.

Figure 4:
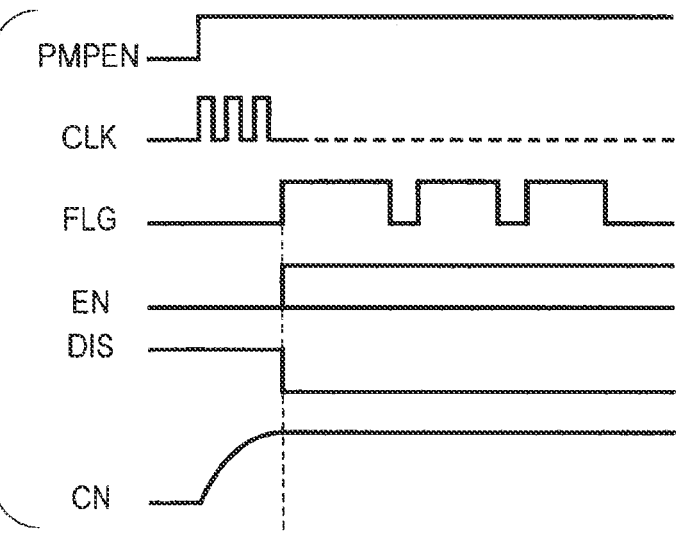
FIG. 4 is a timing chart for explaining the operation of the circuit shown in FIG. 2.

Referring to FIG. 4, the operation of the boost circuit shown in FIG. 2 is described.

To start with, when the pump enable signal PMPEN is an inactive state, the flag signal FLG, which is output from the operational amplifier 14, is at a low level, and the flop-flop circuit 15 is reset by the inversion signal PMPENB of the pump enable signal PMPEN. Accordingly, the enable signal EN is at a low level and the disable signal DIS is set at a high level. The transistor 17, to the gate electrode of which the enable signal EN is supplied, is turned off, and the transistor 18, to the gate electrode of which the disable signal DIS is supplied, is turned on. Thus, the connection node between the capacitor 16 and transistor 18 is set at the ground potential. In addition, the monitor voltage VMON is determined by the division of the resistors 12 and 13.

In this state, if the pump enable signal PMPEN is activated, the charge pump circuit 11 boosts the power supply voltage VDD in accordance with the clock signal CLK. If the monitor voltage VMON of the voltage division circuit VD, to which the output voltage of the charge pump circuit 11 is supplied, becomes higher than the reference voltage VREF, the flag voltage FLG of the high level is output from the operational amplifier 14.

Based on the flag signal FLG, the charge pump circuit 11 stops the boost operation. In addition, the flip-flop circuit 15 is set by the flag signal FLG. Thus, the enable signal EN, which is output from the set output terminal Q, is set at the high level, and the disable signal DIS, which is output from the reset output terminal Qn, is set at the low level. The transistor 17, to the gate electrode of which the enable signal EN is supplied, is turned on, and the transistor 18, to the gate electrode of which the disable signal DIS is supplied, is turned off. Accordingly, the other end of the capacitor 16 is connected to the one input terminal of the operational amplifier 14 via the transistor 17.

The ON state of the transistor 17 and the OFF state of the transistor 18 are held by the enable signal EN and disable signal DIS, which are output from the flip-flop circuit 15. Thus, even when the output signal of the charge pump circuit 11 lowers and the flag signal FLG that is output from the operational amplifier 14 is set at the low level, the capacitor 16 is connected between the output terminal of the charge pump circuit 11 and the one input terminal of the operational amplifier 14. The capacitor 16 prevents a ripple component from occurring in the output voltage of the charge-pump circuit 11.

According to the above-described first embodiment, the transistor 17 is provided between the other end of the capacitor 16, which is connected at one end to the outpour terminal of the charge pump circuit 11, and the one input terminal of the operational amplifier 14. When the flag signal FLG that is output from the operational amplifier 14 is set at the high level and the boost by the charge pump circuit 11 is completed, the transistor 17 is turned on, thereby connecting the other end of the capacitor 16 to the one input terminal of the operational amplifier 14. Thus, when the pump circuit is activated, it is possible to prevent malfunction of the detection circuit, which would occur if the output voltage of the pump circuit quickly rises and the monitor voltage of the detection circuit rises to the reference voltage or above due to coupling of the capacitor. Thereby, such malfunction can be prevented that the operation and stop of the pump circuit are repeated and the boost operation itself of the pump circuit delays, and it is possible to stabilize the operation of the charge pump circuit 11 and to realize a high-speed boost operation.

Moreover, in the case where the boost by the charge pump circuit 11 has been completed, the transistor 17 is turned on and, while the charge pump circuit 11 is being activated by the pump enable signal PMPEN, the other end of the capacitor 16 is connected to the one input terminal of the operational amplifier 14. It is thus possible to suppress a ripple component of the output voltage, when the charge pump circuit 11 performs the boost operation.

Second Embodiment

FIG. 5 shows a second embodiment. In FIG. 5, the same parts as in FIG. 2 are denoted by like reference numerals, and only different parts are described.

In the first embodiment, one end of the current path of the transistor 18 is connected to the connection node CN and the other end thereof is grounded. By contrast, in the second embodiment, a reference voltage VREF is supplied to the other end of the current path of the transistor 18.

Figure 6:
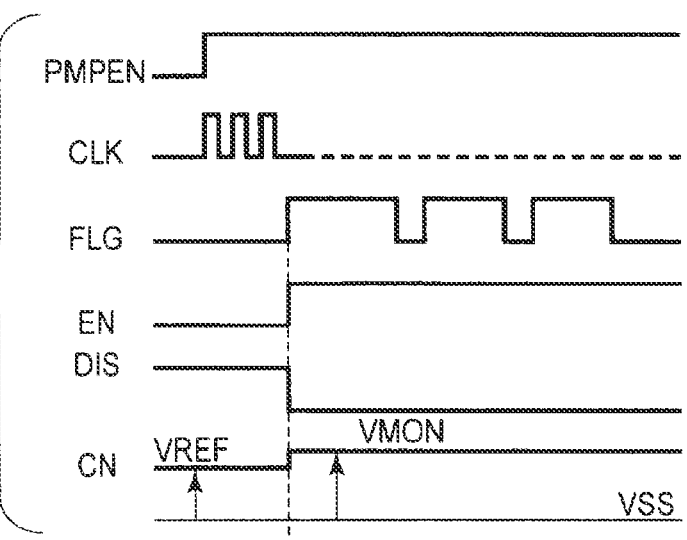
FIG. 6 is a timing chart for explaining the operation of the circuit shown in FIG. 5.

In this structure, as shown in FIG. 6, in the state in which the pump enable signal PMPEN is at the low level and the charge pump circuit 11 is inactive, the flag signal FLG that is output from the operational amplifier 14 is at the low level and the flip-flop circuit 15 is reset by the inversion signal PMPENB of the pump enable signal PMPEN. Accordingly, the enable signal EN is at the low level and the disable signal DIS is at the high level. The transistor 17, to the gate electrode of which the enable signal EN is supplied, is turned off, and the transistor 18, to the gate electrode of which the disable signal DIS is supplied, is turned on. Thus, the reference voltage VREF is supplied to the connection node between the capacitor 16 and the transistor 18.

Thereafter, if the pump enable signal PMPEN is set at the high level, the boost operation of the charge pump circuit 11 is started. If the output voltage of the charge pump circuit 11 rises and the output voltage VMON of the voltage division circuit VD becomes higher than the reference voltage VREF, the flag signal FLG that is output from the operational amplifier 14 rises to the high level. Accordingly, the enable signal EN that is output from the set output terminal of the flip-flop circuit 15 is set at the high level, and the disable signal DIS that is output from the reset output terminal of the flip-flop circuit 15 is set at the low level. Hence, the transistor 18 is turned off and the transistor 17 is turned on. Accordingly, the potential of the connection node CN between the transistor 17 and capacitor 16 varies from the reference voltage VREF to the monitor voltage VMON. The potential difference between the reference voltage VREF and the monitor voltage VMON is less than in the case of the first embodiment. It is thus possible to prevent a ripple component from occurring in the output voltage of the charge pump circuit 11. Therefore, the output voltage of the charge pump circuit 11 can stably be maintained.

By the second embodiment, too, the same advantageous effects as in the first embodiment can be obtained. Furthermore, according to the second embodiment, in the inactive state of the charge pump circuit 11, the potential of the connection node CN of the capacitor 16 is charged up to the reference voltage VREF. Hence, when the boost by the charge pump circuit 11 is completed and the other end of the capacitor 16 is connected to the one input terminal of the operational amplifier 14, the occurrence of noise can be prevented. Therefore, it is possible to prevent a ripple component from occurring in the output voltage of the charge pump circuit 11 and to stably maintain the output voltage.

Third Embodiment

FIG. 7 shows a third embodiment. In FIG. 7, the same parts as in FIG. 2 and FIG. 5 are denoted by like reference numerals, and only different parts are described.

In the first and second embodiments, the response speed of the arithmetic amplifier 14 at the time of activating the charge pump circuit 11 is improved and malfunction is prevented. In the third embodiment, an overshoot at the time of activating the charge pump circuit 11 is also improved. For this purpose, an operational amplifier 19 is further provided as a second detection circuit which detects the output voltage of the charge pump circuit 11 earlier than the operational amplifier 14.

Specifically, as shown in FIG. 7, the voltage division circuit VD is composed of a series circuit of resistors 12-1 and 12-2 and resistor 13. A monitor voltage VMON is output from a connection node between the resistor 12-2 and resistor 13, and the monitor voltage VMON is supplied to one input terminal of the operational amplifier 14. The flag signal FLG that is output from the output terminal of the operational amplifier 14 is supplied to only the charge pump circuit 11.

On the other hand, a monitor voltage VMON2, which is output from a connection node between the resistors 12-1 and 12-2, is supplied to one input terminal of the operational amplifier 19, and a reference voltage VREF is supplied to the other input terminal of the operational amplifier 19. The operational amplifier 19 compares the monitor voltage VMON2 and reference voltage VREF, and outputs, from an output terminal thereof, a flag signal FLG2 as a second flag signal which is the comparison result. The flag signal FLG2 is supplied to a set input terminal S of the flip-flop circuit 15.

Figure 8:
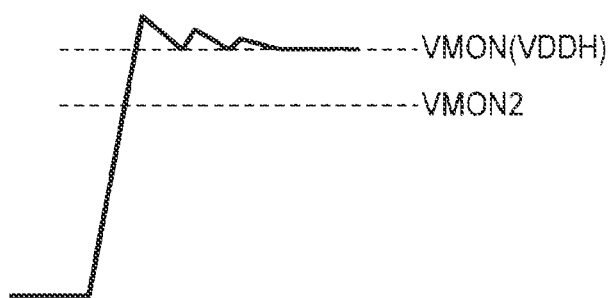
FIG. 8 is a waveform diagram showing an example of an input voltage of a detection circuit according to the third embodiment.

FIG. 8 shows the relationship between the monitor voltages VMON and VMON2. The monitor voltage VMON2 is a voltage which is lower than the monitor voltage VMON. Thus, the operational amplifier 19 outputs the flag signal FLG2 before the flag signal FLG is output from the operational amplifier 14.

Figure 9:
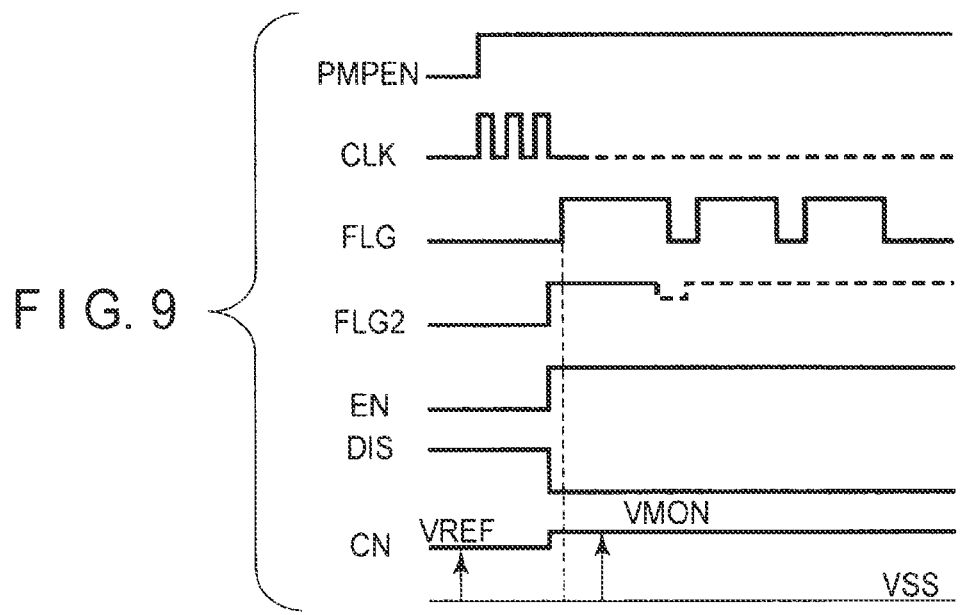
FIG. 9 is a timing chart for explaining the operation of the circuit shown in FIG. 7.

In the above-described structure, as shown in FIG. 9, in the state in which the pump enable signal PMPEN is at the low level and the charge pump circuit 11 is inactive, the flag signal FLG2 that is output from the operational amplifier 19 is at the low level and the flip-flop circuit 15 is reset by the inversion signal PMPENB of the pump enable signal PMPEN. Accordingly, the enable signal EN is at the low level and the disable signal DIS is at the high level. The transistor 17, to the gate electrode of which the enable signal EN is supplied, is turned off, and the transistor 18, to the gate electrode of which the disable signal DIS is supplied, is turned on. Thus, the reference voltage VREF is supplied to the connection node between the capacitor 16 and the transistor 18.

On the other hand, if the pump enable signal PMPEN is set at the high level, the boost operation of the charge pump circuit 11 is started. If the output voltage of the charge pump circuit 11 rises and the output voltage VMON2 of the voltage division circuit VD becomes higher than the reference voltage VREF, the flag signal FLG2 that is output from the operational amplifier 19 rises to the high level. Accordingly, the enable signal EN that is output from the set output terminal of the flip-flop circuit 15 is set at the high level, and the disable signal DIS that is output from the reset output terminal of the flip-flop circuit 15 is set at the low level. Hence, the transistor 18 is turned off and the transistor 17 is turned on. Accordingly, the capacitor 16 is connected to the one input terminal of the operational amplifier 14.

Thereafter, if the output voltage of the charge pump circuit 11 further rises and the output voltage VMON of the voltage division circuit VD becomes higher than the reference voltage VREF, the flag signal FLG that is output from the operational amplifier 14 rises to the high level. Thus, the boost operation of the charge pump circuit 11 is stopped. In this manner, since the capacitor 16 is connected to the one input terminal of the operational amplifier 14 before the operation of the operational amplifier 14 is started, an overshoot of the voltage, which is output from the charge pump circuit 11, can be suppressed.

Accordingly to the third embodiment, the operational amplifier 19 is provided, and when the monitor voltage VMON2, which is lower than the monitor voltage VMON of the operational amplifier 14, is detected by the operational amplifier 19, the flag signal FLG2 is output from the operational amplifier 19. Based on the flag signal FLG2, the capacitor 16 is connected to the one input terminal of the operational amplifier 14. Therefore, the response speed of the detection circuit can be improved, and the overshoot of the voltage, which is output from the charge pump circuit 11, can be suppressed.

Moreover, immediately after the start of the boost operation of the charge pump circuit 11, the capacitor 16 is not connected to the one input terminal of the operational amplifier 14. Thus, the malfunction of the operational amplifier 14 can be prevented, and the high-speed boost operation can be performed.

Besides, the same advantageous effects as in the first and second embodiments can be obtained. Therefore, it is possible to suppress an overshoot and a ripple component at high speed, and to output a stable output voltage.

Fourth Embodiment

Figure 10:
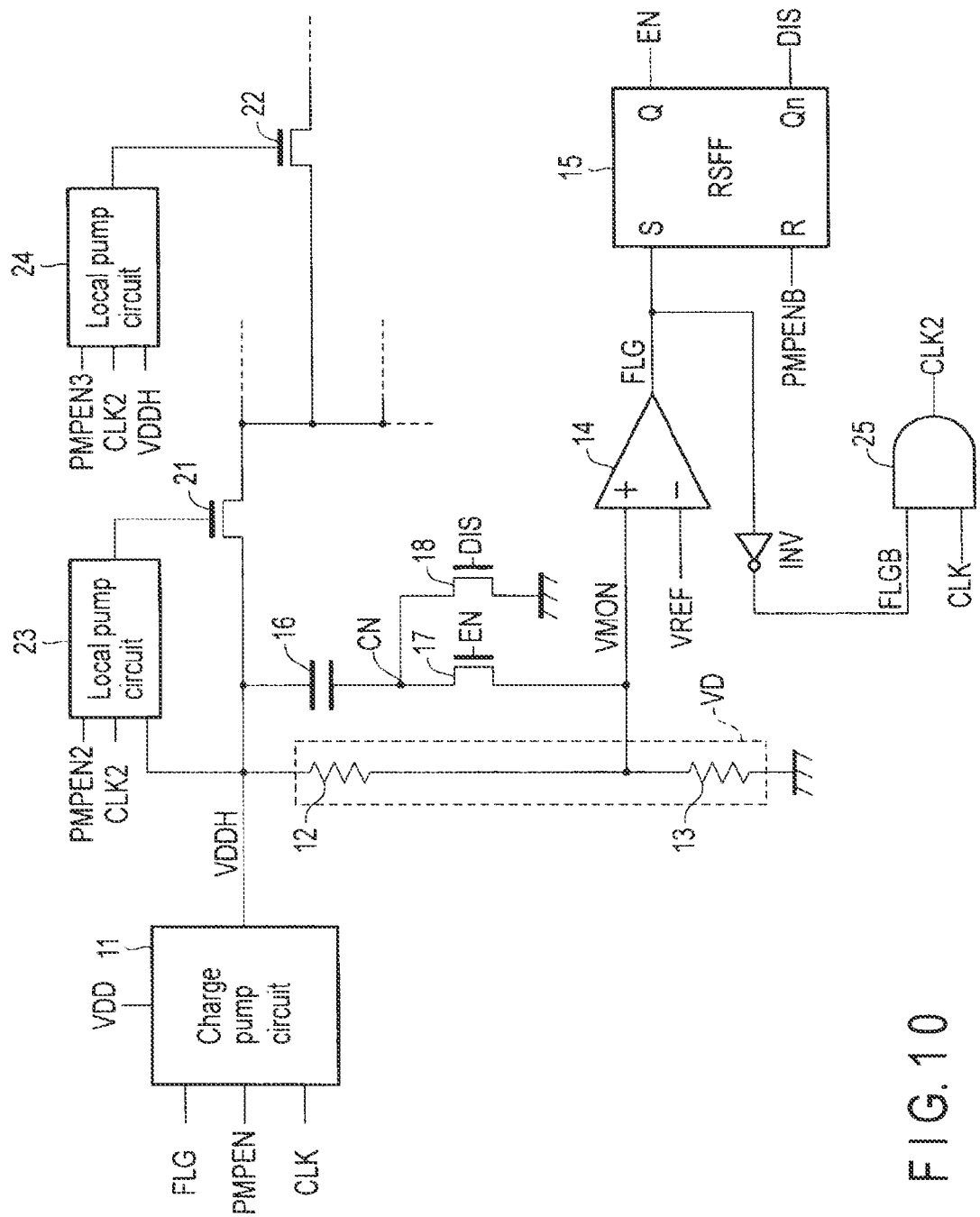
FIG. 10 is a circuit diagram showing the structure of a voltage generation circuit according to a fourth embodiment.

FIG. 10 shows a fourth embodiment. In FIG. 10, the same parts as in FIG. 2 are denoted by like reference numerals, and only different parts are described.

In a NAND flash memory, in order to transfer a high voltage, which is generated by using a charge pump circuit, to, e.g. a memory cell array, an N-channel MOS transistor is used. In this case, in order to prevent the voltage, which is transferred, from decreasing by a degree corresponding to a threshold voltage, it is necessary to supply a voltage, which is higher than the voltage that is transferred by a degree corresponding to the threshold voltage of the N-channel MOS transistor, to the gate electrode of the N-channel MOS transistor. For this purpose, it is necessary to boost the voltage that is supplied to the gate electrode of the transistor. In order to increase the degree of freedom of circuit arrangement and to suppress the electric current consumption, a small-sized charge pump circuit (23 or 24 in FIG. 10) is disposed at the gate electrode of the N-channel MOS transistor. This charge pump circuit is referred to as a local pump circuit.

The local pump circuit does not include a detection circuit which detects an output voltage and control a pump operation. Thus, even after the gate voltage of the transfer transistor has been sufficiently boosted, charge/discharge of the capacitor, which constitutes the pump circuit, is repeated in sync with a clock signal. Consequently, electric current is consumed while the local pump circuit is being activated. A great number of local pump circuits are used over the entirety of the chip, and this leads to a factor which increases the current consumption.

Taking this into account, in the fourth embodiment, the operation of the local pump circuit is controlled by using the detection circuit which is provided in the charge pump circuit 11, thereby reducing the current consumption.

In FIG. 10, one end of the current path of an N-channel MOS transistor 21 for transfer is connected to, e.g. the output terminal of the charge pump circuit 11, and the other end of the current path of the transistor 21 is connected to a word line driving circuit, which is not shown. In addition, one end of the current path of an N-channel MOS transistor 22 for transfer is connected to, e.g. the other end of the current path of the transistor 21. The other end of the current path of the transistor 22 is connected to, e.g. a word line.

The local pump circuit 23 is supplied with, for example, a pump enable signal PMPEN2, a clock signal CLK2 which is supplied from an AND circuit 25 (to be described later), and an output voltage VDDH of the charge pump circuit 11. In the state in which the pump enable signal PMPEN2 is activated, the local pump circuit 23 boosts the voltage VDDH, based on the clock signal CLK2, and generates a voltage of VDDH+Vth (Vth: the threshold voltage of the N-channel MOS transistor) or more. The output voltage of the local pump circuit 23 is supplied to the gate electrode of the transistor 21.

In addition, the local pump circuit 24 is supplied with, for example, a pump enable signal PMPEN3, the clock signal CLK2, and the output voltage VDDH of the charge pump circuit 11. In the state in which the pump enable signal PMPEN3 is activated, the local pump circuit 24 boosts the voltage VDDH, based on the clock signal CLK2, and generates a voltage of VDDH+Vth or more. The output voltage of the local pump circuit 24 is supplied to the gate electrode of the transistor 22.

On the other hand, the flag signal FLG, which is output from the operational amplifier 14 that constitutes the detection circuit of the charge pump circuit 11, is supplied to the charge pump circuit 11 and flip-flop circuit 15. In addition, an inversion signal FLGB of the flag signal FLG, which is inverted by, e.g. an inverter circuit INV, is supplied to one input terminal of a logical circuit, for instance, an AND circuit 25. A clock signal CLK, which is supplied to the charge pump circuit 11, is supplied to the other input terminal of the AND circuit 25. The clock signal CLK2, which is output from the AND circuit 25, is supplied to the local pump circuits 23 and 24.

In the above-described structure, if the pump enable signals PMPEN, PMPEN2 and PMPEN3 rise to the high level, the charge pump circuit 11 is activated and starts the boost operation. At this time, since the output voltage VMON of the division circuit VD is lower than the reference voltage VREF, the flag signal FLG, which is output from the operational amplifier 14 that constitutes the detection circuit, is at the low level. The clock signal CLK2 is output from the output terminal of the AND circuit 25, to which the inversion signal FLGB of this flag signal is supplied. Accordingly, the local pump circuits 23 and 24 also start the boost operation.

In this state, if the output voltage VMON of the division circuit VD becomes higher than the reference voltage VREF, the flag signal FLG that is output from the operational amplifier 14 is set at the high level. Thus, the boost operation of the charge pump circuit 11 is stopped. On the other hand, the AND circuit 25, to which the inversion signal FLGB of the flag signal FLG is supplied, stops the sending of the clock signal CLK2. Accordingly, the local pump circuits 23 and 24 stop the boost operation. At this time, the pump enable signals PMPEN2 and PMPEN3 are kept at the high level. Thus, the boosted voltages are continuously output from the output terminals of the local pump circuits 23 and 24, and the gate voltages of the transistors 21 and 22 are maintained.

The output voltage of the local pump circuit 23, 24 decreases due to an off-leak current of the diode-connected transistors which constitute the local pump circuit. However, since the output voltage of the charge pump circuit 11 similarly decreases, if the monitor voltage VMON that is output from the voltage division circuit VD becomes lower than the reference voltage VREF, the flag signal FLG that is output from the operational amplifier 14 decreases to the low level and the charge pump circuit 11 resumes the boost operation. At the same time, since the clock signal CLK2 is output from the AND circuit 25, the local pump circuit 23, 24 resumes the boost operation. By this operation, the local pump circuits 23 and 24 are controlled.

According to the fourth embodiment, the clock signal CLK2 of the local pump circuit 23, 24 is controlled by using the flag signal FLG which is output from the operational amplifier 14 that functions as the detection circuit of the charge pump 11. Therefore, the local pump circuits 23 and 24 can be controlled in sync with the operation of the charge pump circuit 11, and an increase in electric current consumption by the local pump circuits 23 and 24 can be prevented.

FIG. 10 shows the case in which the fourth embodiment is applied to the first embodiment. Alternatively, the fourth embodiment can be applied to the second and third embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage generation circuit comprising:
   a charge pump circuit configured to output a first voltage;
   a voltage division circuit configured to divide the first voltage to a second voltage;
   a first amplifier having a first input terminal and a second input terminal, the first input terminal of the first amplifier configured to receive the second voltage, the second input terminal of the first amplifier configured to receive a third voltage, the first amplifier configured to output a signal which controls the charge pump circuit; and
   a capacitor having a first end connected to an output terminal of the charge pump circuit and a second end connected to the first input terminal of the first amplifier via a first transistor.

2. The voltage generation circuit according to claim 1, wherein a first end of the first transistor is connected to the second end of the capacitor, and a second end of the first transistor is connected to the first input terminal of the first amplifier.

3. The voltage generation circuit according to claim 1, further comprising:
a second transistor, a first end of the second transistor connected to the second end of the capacitor and a second end of the second transistor connected to a ground terminal.

4. The voltage generation circuit according to claim 3, further comprising:
a logical circuit, an input terminal of the logical circuit connected to an output terminal of the first amplifier and a second output terminal of the logical circuit connected to a gate of the second transistor.

5. The voltage generation circuit according to claim 4, wherein
the second transistor is configured to establish a connection between the capacitor and the ground terminal, based on an output signal from the second output terminal of the logical circuit, until the first voltage is output from the charge pump circuit.

6. The voltage generation circuit according to claim 1, wherein the voltage division circuit includes:
a first resistance, a first end of the first resistance connected to the output terminal of the charge pump circuit and a second end of the first resistance connected to the first input terminal of the first amplifier; and
a second resistance, a first end of the second resistance connected to the second end of the first resistance and a second end of the second resistance connected to a ground terminal.

7. The voltage generation circuit according to claim 1, further comprising:
a logical circuit, an input terminal of the logical circuit connected to an output terminal of the first amplifier and a first output terminal of the logical circuit connected to a gate of the first transistor.

8. The voltage generation circuit according to claim 7, wherein
the first transistor is configured to cut off a connection between the capacitor and the first amplifier, based on an output signal from the first output terminal of the logical circuit, until the first voltage is output from the charge pump circuit.

* * * * *